(12) United States Patent  
Cartier et al.

(10) Patent No.: US 7,999,323 B2  
(45) Date of Patent: Aug. 16, 2011

(54) USING METAL/METAL NITRIDE BILAYERS AS GATE ELECTRODES IN SELF-ALIGNED AGGRESSIVELY SCALED CMOS DEVICES

(75) Inventors: Eduard A. Cartier, New York, NY (US); Matthew W. Copel, Yorktown Heights, NY (US); Bruce B. Doris, Brewster, NY (US); Rajarao Jammy, Hopewell Junction, NY (US); Young-Hee Kim, Yorktown Heights, NY (US); Barry P. Linder, Hastings-on-Hudson, NY (US); Vijay Narayanan, New York, NY (US); Vamsi K. Paruchuri, New York, NY (US); Keith Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/542,087

(22) Filed: Aug. 17, 2009

(65) Prior Publication Data  
US 2009/0302399 A1    Dec. 10, 2009

Related U.S. Application Data

(62) Division of application No. 11/111,592, filed on Apr. 21, 2005, now Pat. No. 7,598,545.

(51) Int. Cl.  
*H01L 29/00* (2006.01)

(52) U.S. Cl. .............. 257/351; 257/371; 257/E27.046; 257/E27.06; 438/154

(58) Field of Classification Search .......... 257/411, 257/E29.132, 351, 371, E27.046, E27.06; 438/591, 154  
See application file for complete search history.

(56) References Cited

U.S. PATENT DOCUMENTS

| 6,166,417 | A | 12/2000 | Bai et al. |
| 6,373,111 | B1 | 4/2002 | Zheng et al. |
| 6,407,435 | B1 | 6/2002 | Ma et al. |
| 6,642,094 | B2 | 11/2003 | Rotondaro et al. |
| 6,858,524 | B2 | 2/2005 | Haukka et al. |
| 7,122,414 | B2 * | 10/2006 | Huotari .................. 438/199 |
| 2004/0108557 | A1 | 6/2004 | Barnak et al. |
| 2005/0064653 | A1 | 3/2005 | Park et al. |

OTHER PUBLICATIONS

Kim H. et al., "Engineering Chemically Abrupt High-k Metal Oxide/Silicon Interfaces Using an Oxygen-Gettering Metal Overlayer", Journal of Applied Physics 96(6):3467-3472 (Sep. 2004).

* cited by examiner

*Primary Examiner* — Matthew E Warren  
*Assistant Examiner* — John Lin  
(74) *Attorney, Agent, or Firm* — Scully, Scott, Murphy & Presser, P.C.; Louis J. Percello, Esq.

(57) ABSTRACT

The present invention is directed to CMOS structures that include at least one nMOS device located on one region of a semiconductor substrate; and at least one pMOS device located on another region of the semiconductor substrate. In accordance with the present invention, the at least one nMOS device includes a gate stack comprising a gate dielectric, a low workfunction elemental metal having a workfunction of less than 4.2 eV, an in-situ metallic capping layer, and a polysilicon encapsulation layer and the at least one pMOS includes a gate stack comprising a gate dielectric, a high workfunction elemental metal having a workfunction of greater than 4.9 eV, a metallic capping layer, and a polysilicon encapsulation layer. The present invention also provides methods of fabricating such a CMOS structure.

18 Claims, 3 Drawing Sheets

USING METAL/METAL NITRIDE BILAYERS AS GATE ELECTRODES IN SELF-ALIGNED AGGRESSIVELY SCALED CMOS DEVICES

CROSS REFERENCE TO RELATED APPLICATIONS

This application is a divisional application of U.S. Ser. No. 11/111,592, filed on Apr. 21, 2005.

DESCRIPTION

1. Field of the Invention

The present invention relates to complementary metal oxide semiconductor (CMOS) structures and methods of forming the same. More particularly, the present invention provides a CMOS structure that includes an nMOS device that contains a low workfunction metal/metal nitride bilayer stack and a pMOS device that contains a high workfunction metal/metal nitride bilayer stack, wherein both nMOS and pMOS stacks remain stable during conventional high temperature self-aligned CMOS processing.

2. Background of the Invention

As is known to those skilled in the semiconductor art, transistors are the main building blocks of integrated circuits (ICs). Modem ICs interconnect millions of densely configured transistors that perform a wide variety of functions. To achieve this densely packed configuration, the physical dimensions of the transistors are typically scaled down to the sub-micron regime. Generally, the transistors used in the sub-micron regime typically include a polysilicon gate. However, polysilicon gates may suffer device performance degradation due to a polysilicon depletion effect in which an electric field applied to a polysilicon gate removes carriers (holes in a p-type doped polysilicon, or electrons in an n-type doped polysilicon) so as to create a depletion of carriers in the area of the polysilicon gate near the underlying gate dielectric of the transistor. This depletion effect results in a reduction in the strength of the electric field at the surface of the CMOS device when a voltage is applied to the polysilicon gate electrode, which can have an adverse affect on the transistor performance.

One proposed way of improving the performance of sub-micron transistors is to use metal gates in place of conventional polysilicon gates. While replacing traditional polysilicon gates with metal or metal alloy gate electrodes eliminates the polysilicon depletion effect, there are still problems associated with the use of such metal gates. One problem encountered is that the carriers from the metal gate can diffuse into the underlying gate dielectric material, thus causing shorting of the device.

Another problem encountered with the use of metal gates is workfunction mismatch, wherein the workfunctions of the metal gate p-channel transistor and the metal gate n-channel transistor do not match the workfunctions of the p- and n-channel transistors of the polysilicon gate. It is well-known that in CMOS devices, there are generally two different types of gate electrodes, an n-channel gate electrode and a p-channel gate electrode, which have two different workfunction values (i.e., an energy level of a semiconductor which can be near the valence or the conduction band of the material). The workfunction values are typically about 4.1 and 5.2 electron volts (eV) for the n-and p-channel electrodes respectively, and the values are generally formed by doping the polysilicon to be either n- or p-type.

In contrast, previously proposed metal gate electrodes have focused on using one type of metal for both channels of the gate electrode, with a workfunction that is located in the middle of the p- and n-channel workfunction range (e.g., about 4.7 eV). A drawback to this mid-gap workfunction approach is that this type of metal gate device cannot easily achieve a desirable small threshold voltage, which is the amount of voltage that determines the transistor's 'on' and 'off' states, without causing degradation in device performance.

Low workfunction metal gates, which have a workfunction below the mid-gap range, i.e., less than 4.2 eV, are required for dual metal CMOS to substitute for n+ polysilicon gates that are currently being used in conventional CMOS transistors. Likewise, high workfunction metal gates, which have a workfunction above the mid-gap range, i.e., greater than 4.9 eV, are needed as a substitute for p+ polysilicon gates. Well-known band edge n-field effect transistor (FET) metal gates (including metals such as, for example, Ti, V and Zr) with low workfunctions are inherently not stable after going though standard high temperature self-aligned CMOS processes. By "high temperature", it is meant a temperature of about 550° C. or greater.

Due to this inadequate thermal stability of low workfunction metals, there is a need for providing a CMOS structure having a gate stack that can be used to achieve both nFET and pFET workfunctions.

SUMMARY OF THE INVENTION

The present invention relates to a complementary metal oxide semiconductor (CMOS) structure that includes a pMOS device and an nMOS device which include material layers that avoid the thermal instability issue of low workfunction elemental metals thus permitting the same to be incorporated into the nMOS device. Specifically, and in broad terms, the CMOS structure of the present invention comprises:

a semiconductor substrate;

at least one nMOS device located on one region of said semiconductor substrate; and at least one pMOS device located on another region of said semiconductor substrate, where said at least one nMOS device includes a gate stack comprising at least a low workfunction elemental metal having a workfunction of less than 4.2 eV and an in-situ metallic capping layer, and said at least one pMOS includes a gate stack comprising at least a high workfunction elemental metal having a workfunction of greater than 4.9 eV and a metallic capping layer.

Each of the MOS devices of the present invention also includes a gate dielectric that is located beneath the metal electrode and a polysilicon encapsulation layer that is located atop the metallic capping layer. The dielectric layer may be the same or different insulating material for the nMOS device and the pMOS device.

In accordance with the present invention, the gate stack of both the nMOS and pMOS device have vertical sidewalls that are aligned.

In the nMOS device of the present invention, the low workfunction metal and the metallic capping layer are formed in such a manner that the vacuum between the depositions is not broken. In the case of the pMOS device, the high workfunction metal is exposed to an ambient or oxidized prior to the deposition of the metallic capping layer. The purpose of this is to provide sufficient oxygen to the high workfunction metal to compensate for the oxygen vacancies that are typically present at the interface between a high workfunction metal and a high k dielectric.

The present invention is also related to a semiconductor structure having a controlled interface layer comprising:
a semiconductor substrate;
an interfacial layer located on a surface of said semiconductor substrate;
a dielectric layer having a thickness of less than 5 nm positioned on said interface layer,
a layer of metal atop said dielectric layer wherein said metal layer has a thickness of less than 3 nm, said thickness affecting said interface; and
a metallic capping layer protecting said metal.

The interface layer is a Si oxide or oxynitride layer whose thickness is controlled by the thickness of the low workfunction metal atop the dielectric layer as shown in Table 1 for the specific of Ti, wherein the electrical inversion thickness reduces as the thickness of the Ti layer increases. It is believed that low workfunction metals, since they are easily oxidized, act as interface oxide "scavenging" layers, thus with increasing thickness of the low workfunction metal, more oxygen is scavenged from the interface resulting in aggressively scaled devices. Limiting the thickness of the low workfunction metal to <3 nm ensures the presence of some interfacial $SiO_2$, critical to the channel electron mobility and performance of the device.

DETAILED DESCRIPTION OF THE INVENTION

Figure 1A:
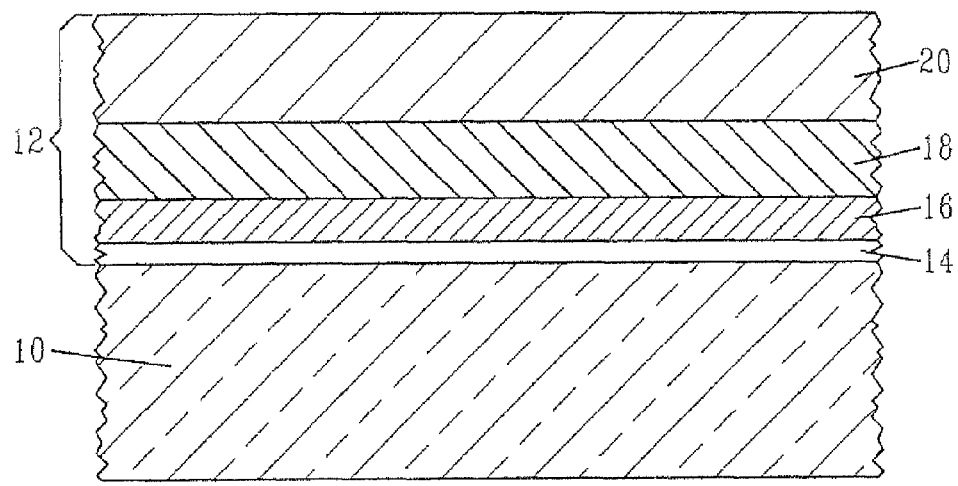
FIGS. 1A-1B are pictorial representations (through cross sectional views) illustrating the basic processing steps that are used in the present invention for forming an nMOS (or nFET) device including a bilayer comprising a low workfunction elemental metal and an in-situ metallic capping layer.

The present invention, which provides a CMOS structure including a low workfunction elemental metal/metallic capping bilayer as an nMOS gate electrode and a high workfunction elemental metal/metallic capping bilayer as a pMOS gate electrode and methods of forming the structure, will now be described in greater detail by referring to the following discussion and drawings that accompany the present application. It is noted that the drawings of the present invention are provided for illustrative purposes and thus they are not drawn to scale.

In accordance with the present invention, the nFET device including the inventive nMOS gate electrode can be completely or partially formed prior to, or after, completely or partially forming the pFET device. In the present invention, a conventional block mask is formed atop a portion of a substrate wherein one of the FET devices (e.g., second device) is to be subsequently formed, and then the other device of opposite conductivity (e.g., first device) is formed in the portion of the substrate not containing the block mask. After partial or complete fabrication of the first device, the block mask is removed and another block mask can be, but not always, formed on the portion of the substrate including the first device. The second device is then partially or completely formed on the portion of the substrate that does not include the first device.

In the present invention, the initial block mask can be formed directly on a surface of the substrate, or atop a gate dielectric that is formed atop the substrate. The first instance allows for cases in which the gate dielectric in the first and second FET devices is different, while the second instance allows for cases in which the gate dielectric is the same in both the first and second FET devices.

In a specific embodiment, after deposition of one of the FET (either nFET or pFET) metal gate stacks, a conventional block mask is formed atop the device region where the appropriate stack is to remain, i.e., the nFET gate stack is deposited on a gate dielectric on the entire wafer, and then a block mask is formed atop the nFET regions of the wafer. Using this block mask as an etch mask, this metal gate stack is etched away from the regions where the second FET gate stack is to be deposited. Before deposition of the second stack, the block mask is removed by wet chemical processes (that are selective to the first FET gate stack) that are well known to those skilled in the art. Subsequent to this the second metal FET gate stack is partially or completely formed on the regions from which the first gate stack was etched away and also atop the first gate stack in regions where the first gate stack appropriately remains. In this embodiment, there is no limitation on whether the first gate stack is nFET or pFET.

For illustrative purposes, the nFET of the present invention will be described first, followed by the pFET. No limitations should be read into this order of forming the nFET prior to forming the pFET, since the order of their formation is not critical to the present invention.

nFET formation: nFET formation begins by first forming the gate stack 12 shown in FIG. 1A on the surface of a semiconductor substrate 10; this structure represents only a portion of the substrate in which nFET formation is to occur. As shown, the gate stack 12 comprises a gate dielectric 14, a low workfunction metal 16, a metallic capping layer 18, and a polysilicon encapsulation layer 20.

The semiconductor substrate 10 of the structure shown in FIG. 1A comprises any semiconducting material including, but not limited to: Si, Ge, SiGe, SiC, SiGeC, Ge, GaAs, GaN, InAs, InP and all other III/V or II/VI compound semiconductors. Semiconductor substrate 10 may also comprise an organic semiconductor or a layered semiconductor such as Si/SiGe, a silicon-on-insulator (SOI), a SiGe-on-insulator (SGOI) or germanium-on-insulator (GOI). In some embodiments of the present invention, it is preferred that the semiconductor substrate 10 be composed of a Si-containing semiconductor material, i.e., a semiconductor material that includes silicon. The semiconductor substrate 10 may be doped, undoped or contain doped and undoped regions therein. The semiconductor substrate 10 may include a single crystal orientation or it may include at least two coplanar surface regions that have different crystal orientations (the latter substrate is referred to in the art as a hybrid substrate) when a hybrid substrate is employed, the nFET is typically formed on a (100) crystal surface, while the pFET is typically formed on a (110) crystal plane. The hybrid substrate can be formed by techniques that are well known in the art.

The semiconductor substrate 10 may also include a first doped (n- or p-) region, and a second doped (n- or p-) region. For clarity, the doped regions are not specifically shown in the drawing of the present application. The first doped region and the second doped region may be the same, or they may have different conductivities and/or doping concentrations. These doped regions are known as "wells" and they are formed utilizing conventional ion implantation processes.

At least one isolation region (not shown) is then typically formed into the semiconductor substrate 10. The isolation region may be a trench isolation region or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be formed utilizing a so-called local oxidation of silicon process. Note that the at least one isolation region provides isolation between neighboring gate regions, typically required when the neighboring gates have opposite conductivities, i.e., nFETs and pFETs. The neighboring gate regions can have the same conductivity (i.e., both n- or p-type), or alternatively they can have different conductivities (i.e., one n-type and the other p-type).

After forming the at least one isolation region within the semiconductor substrate 10, a gate dielectric 14 is formed on a surface of the structure. The gate dielectric 14 can be formed by a thermal growth process such as, for example, oxidation or oxynitridation. Alternatively, the gate dielectric 14 can be formed by a deposition process such as, for example, chemical vapor deposition (CVD), plasma-assisted CVD, metalorganic chemical vapor deposition (MOCVD), atomic layer deposition (ALD), evaporation, reactive sputtering, chemical solution deposition and other like deposition processes. The gate dielectric 14 may also be formed utilizing any combination of the above processes.

The gate dielectric 14 is comprised of an oxide, oxynitride, nitride, metal silicate and/or nitrided metal silicate. Thus, for example, the gate dielectric 14 can comprise $SiO_2$, nitrided $SiO_2$, $Si_3N_4$, SiON, a high k insulator or multilayers thereof. The term "high k" is used herein to denote an insulator having a dielectric constant of greater than about 4.0, preferably greater than 7.0. Specifically, the high k gate dielectric employed in the present invention includes, but not limited to: $HfO_2$, $ZrO_2$, $Al_2O_3$, $TiO_2$, $La_2O_3$, $SrTiO_3$, $LaAlO_3$, $CeO_2$, $Y_2O_3$ and mixtures thereof. A highly preferred example of a gate dielectric that is employed in the present invention is $SiO_2$ or a stack comprising $SiO_2$ and $HfO_2$ wherein the hafnium oxide is the upper layer of the dielectric stack and the $SiO_2$ is an interfacial dielectric layer.

The physical thickness of the gate dielectric 14 may vary, but typically, the gate dielectric 14 has a thickness from about 0.5 to about 10 nm, with a thickness from about 0.5 to about 3 nm being more typical. In one embodiment, it is preferred that the dielectric layer 14 have a thickness of less than 3 nm, and that this thickness affects an underlying interfacial dielectric layer. The thickness of the gate dielectric plays a role in that making it thicker than 3 nm may prevent the interfacial Si oxide scavenging effect of the low workfunction metal atop this dielectric.

In some embodiments of the present invention, a metallic stabilization layer (not shown) having a thickness of less than 30 Å can be formed atop the dielectric layer 14 prior to deposition of the low workfunction metal. The metallic stabilization layer comprises TiN, TaSiN, TaSi, TaN or HfSi.

Next, a low workfunction elemental metal 16 is formed on the surface of the gate dielectric 14. The term "low workfunction" is used throughout the present application to denote an elemental metal having a workfunction of less than 4.2 eV, preferably from about 3.8 to about 4.1 eV. Elemental metals whose workfunction would be characterized as 'low' and thus can be used in forming the nFET of the present invention include a metal selected from Group IIIB, IVB or VB of the Periodic Table of Elements. Thus, the low workfunction elemental metal 16 may comprise Sc, Y, La, Ti, Zr, Hf, V, Nb or Ta. Preferably, the low workfunction metal 16 comprises Ti, Hf, Ta, Nb or V, with Ti being most preferred.

The low workfunction elemental metal 16 can be formed by a deposition process such as, for example, chemical vapor deposition (CVD), plasma-assisted CVD, physical vapor deposition (PVD), metalorganic chemical vapor deposition (MOCVD), atomic layer deposition (ALD), evaporation, reactive sputtering, chemical solution deposition and other like deposition processes. The low workfunction elemental metal 16 may also be formed utilizing any combination of the above processes.

The physical thickness of the low workfunction elemental metal 16 may vary, but typically, the low workfunction elemental metal 16 has a thickness from about 0.5 to about 5 nm, with a thickness from about 0.5 to about 2 nm being more typical.

Next, and without breaking vacuum between depositions, a metallic capping layer 18 is formed on the surface of the low workfunction elemental metal 16. The metallic capping layer 18 employed for the nFET is an in-situ metallic capping layer since its deposition remains clustered with that of the low workfunction elemental metal 16. The in-situ metallic capping layer 18 comprises a metal nitride or a metal silicon nitride, and provides the functions of (a) protecting the low workfunction elemental metal from the ambient, (b) acts a diffusion barrier to ambient oxygen, and (c) prevents reaction of the low workfunction layer with the polysilicon capping layer The metal component of the metallic capping layer 18 may comprise a metal from Group IVB or VB of the Periodic Table of Elements. Hence, the metallic capping layer 18 may include Ti, Zr, Hf, V, Nb or Ta, with Ti or Ta being highly preferred. By way of example, the metallic capping layer 18 preferably comprises TiN, TaSiN, TiAlN or TaAlN.

The in-situ metallic capping layer 18 is formed by utilizing the same or different deposition process as that of the low workfunction elemental metal 16. The key is not the type of deposition used, but that the deposition of the metallic capping layer 18 remains clustered with that of the low workfunction elemental metal 16.

The physical thickness of the in-situ metallic capping layer 18 may vary, but typically, the metallic capping layer 18 has a thickness from about 5 to about 30 nm, with a thickness from about 5 to about 10 nm being more typical.

It is observed that the present invention allows for the ability to scale the interface and tune the Vt of the device by changing the thickness of the low workfunction metal.

The gate stack 12 shown in FIG. 1A is completed by forming a polysilicon encapsulation layer 20 on the surface of the metallic capping layer 16. The polysilicon encapsulation layer 20 can be formed utilizing a conventional deposition process such as, for example, CVD (using either silane or disilane as a Si source) or PVD. The thickness of the polysilicon encapsulation layer 20 may vary, but typically, and for illustrative purposes the polysilicon encapsulation layer 20 has a thickness from about 70 to about 100 nm.

Figure 1B:
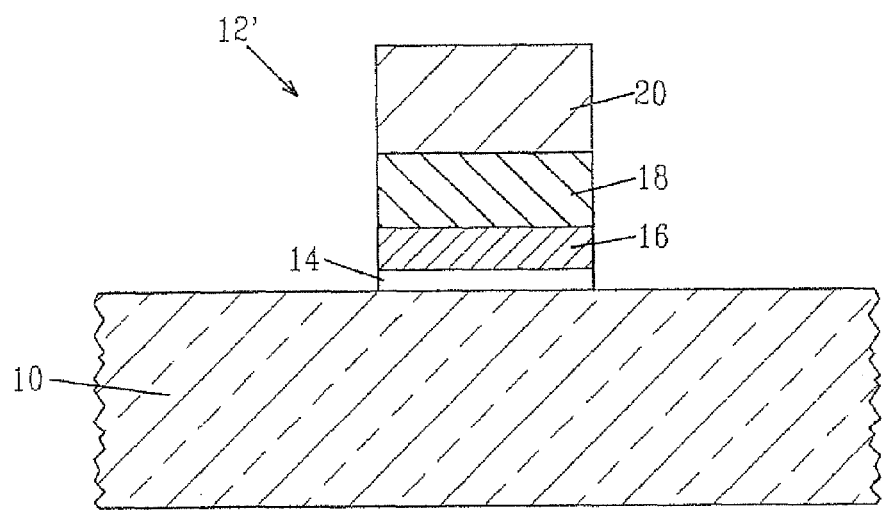

Next, and as shown in FIG. 1B, the structure shown in FIG. 1A is patterned so as to form at least one patterned gate stack 12' on the surface of the semiconductor substrate 10. The patterned gate stack 12' is formed by lithography and etching. The lithographic step includes applying a resist (not shown) to the gate stack 12, exposing the resist to a desired pattern of radiation and developing the exposed resist utilizing a conventional resist developer. The etching step may include one or more dry etching (reactive ion etching, ion beam etching or plasma etching), chemical wet etching, or a combination thereof.

At this point of the present invention, or after pFET formation, at least one spacer (not shown) is typically, but not always, formed on exposed sidewalls of each patterned gate stack 12'. The at least one spacer is comprised of an insulator such as an oxide, nitride, oxynitride and/or any combination thereof. The at least one spacer is formed by deposition and etching.

The width of the at least one spacer must be sufficiently wide such that the source and drain silicide contacts (to be subsequently formed) do not encroach underneath the edges of the patterned gate stack. Typically, the source/drain silicide does not encroach underneath the edges of the patterned gate stack when the at least one spacer has a width, as measured at the bottom, from about 20 to about 80 nm.

The patterned gate stack 12' can also be passivated at this point of the present invention by subjecting the same to a thermal oxidation, nitridation or oxynitridation process. The passivation step forms a thin layer of passivating material about the gate stack. This step may be used instead or in conjunction with the previous step of spacer formation. When used with the spacer formation step, spacer formation occurs after the gate stack passivation process.

Source/drain diffusion regions (with or without the spacers present) are then formed into the substrate. The source/drain diffusion regions, which are also not shown in the drawings, are formed utilizing ion implantation and an annealing step. The annealing step serves to activate the dopants that were implanted by the previous implant step. The conditions for the ion implantation and annealing are well known to those skilled in the art. The source/drain diffusion regions may also include extension implant regions which are formed prior to source/drain implantation using a conventional extension implant. The extension implant may be followed by an activation anneal, or alternatively the dopants implanted during the extension implant and the source/drain implant can be activated using the same activation anneal cycle. Halo implants are also contemplated herein.

Figure 2A:
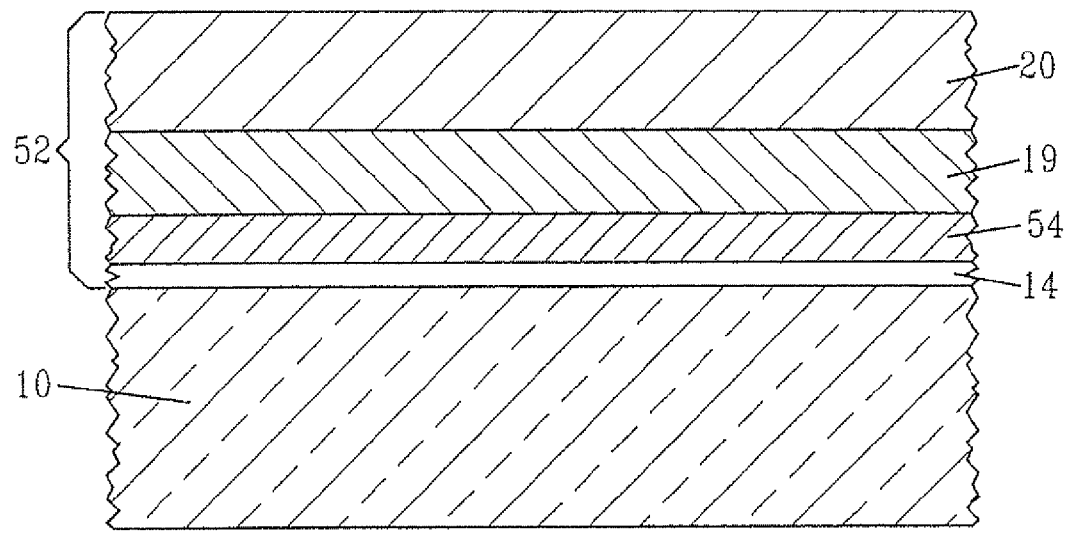
FIGS. 2A-2B are pictorial representations (through cross sectional views) illustrating the basic processing steps that are used in the present invention for forming a pMOS (or pFET) device including a bilayer comprising a high workfunction elemental metal and a metallic capping layer.

The above processing steps form the CMOS structure shown in FIG. 1B. Further CMOS processing such as formation of silicided contacts (source/drain and gate) as well as formation of BEOL (back-end-of-the-line) interconnect levels with metal interconnects can be formed utilizing processing steps that are well known to those skilled in the art can occur after both FET devices, e.g. nFETs and pFETs, are formed.

pFET formation: pFET formation begins by first forming the gate stack 52 shown in FIG. 2A on the surface of the semiconductor substrate 10; this structure represents only a portion of the substrate in which pFET formation is to occur. As shown, the gate stack 52 comprises a gate dielectric 14, a high workfunction metal 54, a metallic capping layer 19, and a polysilicon encapsulation layer 20.

The semiconductor substrate 10 of the structure shown in FIG. 2A is the same as described for the embodiment in which the nFET was formed.

A gate dielectric 14 which can be comprised of the same or different material as that described in the embodiment for the nFET is then formed on a surface of the structure. The gate dielectric 14 can be formed as described above and its physical thickness is also within the range described above. A highly preferred example of a gate dielectric that is employed in forming the pFET of the present invention is $SiO_2$ or a stack comprising $SiO_2$ and $HfO_2$ wherein the hafnium oxide is the upper layer of the dielectric stack and the $SiO_2$ is an interfacial dielectric layer.

In some embodiments of the present invention, a metallic stabilization layer (not shown) having a thickness of less than 10 Å can be formed atop the dielectric layer 14 prior to deposition of the high workfunction metal. The metallic stabilization layer comprises TiN, TaSiN, TaSi, or TaN.

Next, a high workfunction elemental metal 54 is formed on the surface of the gate dielectric. The term "high workfunction" is used throughout the present application to denote an elemental metal having a workfunction of greater than 4.9 eV, preferably from about 5.0 to about 5.2 eV. Elemental metals whose workfunction would be characterized as 'high' and thus can be used in forming the pFET of the present invention include a metal selected from Group VIB, VII or VIII of the Periodic Table of Elements. Thus, the high workfunction elemental metal 54 may comprise Cr, Mo, W, Mn, Tc, Re, Fe, Ru, Os, Co, Rh, Ir, Ni, Pd or Pt. Preferably, the high workfunction metal 54 comprises one of Re, Ru, W or Ir.

The high workfunction elemental metal 54 can be formed by a deposition process such as, for example, chemical vapor deposition (CVD), plasma-assisted CVD, physical vapor deposition (PVD), metalorganic chemical vapor deposition (MOCVD), atomic layer deposition (ALD), evaporation, reactive sputtering, chemical solution deposition and other like deposition processes. The high workfunction elemental metal 54 may also be formed utilizing any combination of the above processes.

The physical thickness of the high workfunction elemental metal 54 may vary, but typically, the high workfunction elemental metal 54 has a thickness from about 2 to about 20 nm, with a thickness from about 2 to about 10 nm being more typical.

Next, and with breaking vacuum between depositions, a metallic capping layer 19 is formed on the surface of the high workfunction elemental metal 54. The metallic capping layer 19 is unlike the case in nFET formation, since its deposition is not clustered to the deposition of the high workfunction elemental metal 54. In forming the pFET, it is highly desired that the high workfunction elemental metal 54 is either exposed to the ambient or oxidized prior to deposition of the metallic capping layer 19. The reason for not clustering the deposition of the metallic capping layer 19 to the deposition of the high workfunction elemental metal 54 is to provide enough oxygen in the structure to compensate for the oxygen vacancies present at the high workfunction/dielectric interface. This step forms a thin (on the order of about 2 nm or less) surface oxide layer (not shown) on the high workfunction elemental metal 54.

When an oxidizing process is used, the structure including the thus deposited high workfunction elemental metal 54 is exposed to an atmosphere including oxygen, while heating at a temperature from about 50° to about 400° C. The time period for the oxidizing process may vary and is not critical to the present invention so long as the time period is sufficient to performed the above-described function.

The metallic capping layer 19 comprises a metal nitride or a metal silicon nitride. The metal component of the metallic capping layer 19 may comprise a metal from Group IVB or VB of the Periodic Table of Elements. Hence, the metallic capping layer 19 may include Ti, Zr, Hf, V, Nb or Ta, with Ti or Ta being highly preferred. By way of example, the metallic capping layer 19 preferably comprises TiN, TaSiN, TiAlN or TiAlN.

The metallic capping layer 19 is formed by utilizing the same or different deposition process as that of the high workfunction elemental metal 54. The key is not the type of deposition used, but that the deposition of the metallic capping layer 19 is not clustered with that of the high workfunction elemental metal 54.

The physical thickness of the metallic capping layer 19 may vary, but typically, the metallic capping layer 19 has a thickness from about 5 to about 30 nm, with a thickness from about 5 to about 10 nm being more typical.

The gate stack 52 shown in FIG. 2A is completed by forming a polysilicon encapsulation layer 20 on the surface of the metallic capping layer 19. The polysilicon encapsulation layer 20 can be formed as described above and its thickness can also be in the range described above.

Figure 2B:
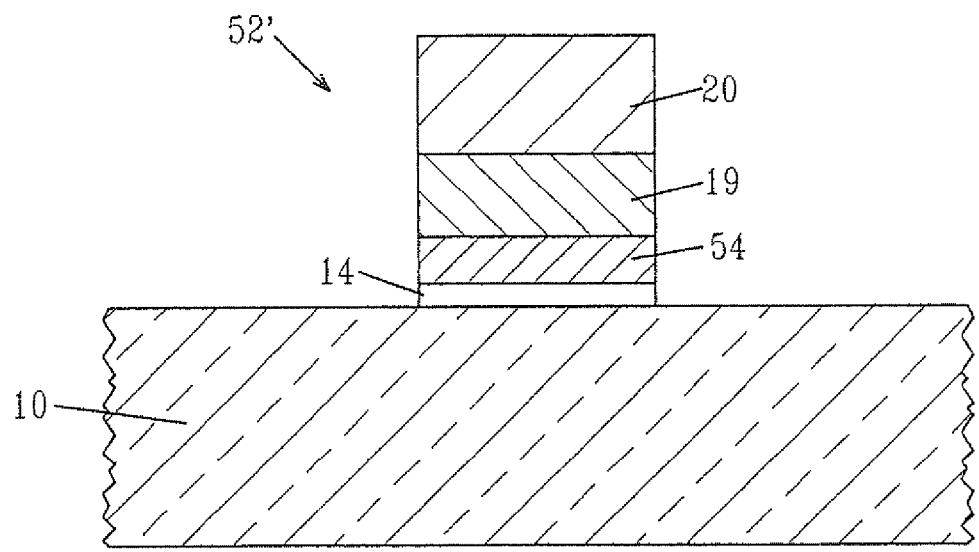

Next, and as shown in FIG. 2B, the structure shown in FIG. 2A is patterned so as to form at least one patterned gate stack 52' on the surface of the semiconductor substrate 10. The patterned gate stack 52' is formed by lithography and etching, as described above.

At this point of the present invention, or after nFET formation, at least one spacer (not shown) is typically, but not always, formed on exposed sidewalls of each patterned gate stack 52'. The at least one spacer is comprised of an insulator such as an oxide, nitride, oxynitride and/or any combination thereof. The at least one spacer is formed by deposition and etching.

The width of the at least one spacer must be sufficiently wide such that the source and drain silicide contacts (to be subsequently formed) do not encroach underneath the edges of the patterned gate stack. Typically, the source/drain silicide does not encroach underneath the edges of the patterned gate stack when the at least one spacer has a width, as measured at the bottom, from about 20 to about 80 nm.

The patterned gate stack 52' can also be passivated at this point of the present invention by subjecting the same to a thermal oxidation, nitridation or oxynitridation process. The passivation step forms a thin layer of passivating material about the gate stack. This step may be used instead or in conjunction with the previous step of spacer formation. When used with the spacer formation step, spacer formation occurs after the gate stack passivation process.

Source/drain diffusion regions (with or without the spacers present) are then formed into the substrate. The source/drain diffusion regions, which are also not shown in the drawings, are formed utilizing ion implantation and an annealing step. The annealing step serves to activate the dopants that were implanted by the previous implant step. The conditions for the ion implantation and annealing are well known to those skilled in the art. The source/drain diffusion regions may also include extension implant regions which are formed prior to source/drain implantation using a conventional extension implant. The extension implant may be followed by an activation anneal, or alternatively the dopants implanted during the extension implant and the source/drain implant can be activated using the same activation anneal cycle. Halo implants are also contemplated herein.

In some embodiment, block masks are used and the pFET device or the nFET device is completely formed and thereafter the block mask is removed and another block mask is formed and the opposite dopant type FET is formed. In yet another embodiment, a block mask is used up to the formation of the metallic capping layer (18 or 19) of one of the devices, then the block mask is removed and thereafter the other device is formed. In the later embodiment, the metallic capping layer 18 of the low workfunction elemental metal may include a surface layer of the high workfunction metal, or the metallic capping layer 19 of the high workfunction elemental metal may include a surface layer of the low workfunction metal.

Figure 3:
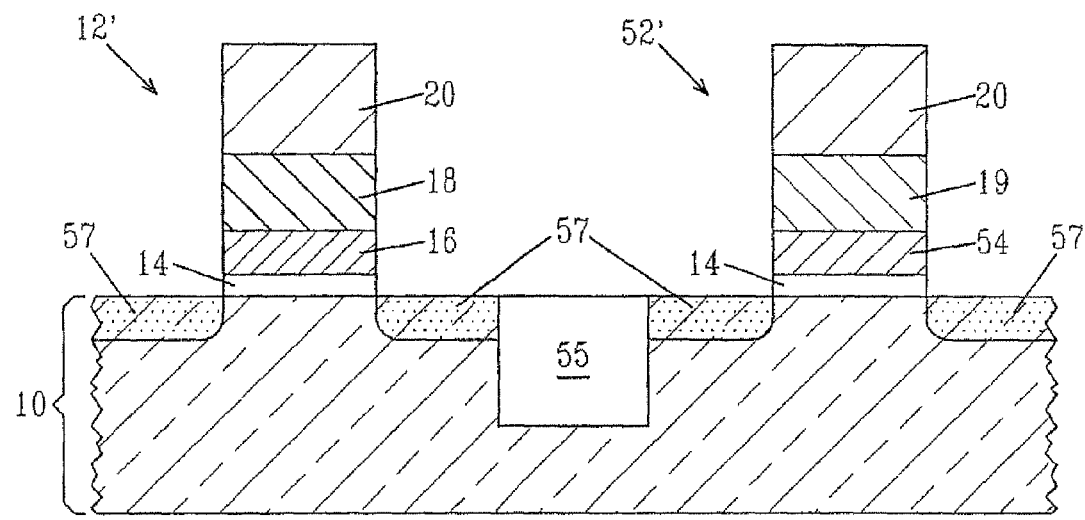
FIG. 3 is a pictorial representation (through a cross sectional view) illustrating a structure including both the nMOS device shown in FIG. 1B and the pMOS device shown in FIG. 2B.

FIG. 3 is a pictorial representation (through a cross sectional view) illustrating a structure including both the nFET device shown in FIG. 1B and the pFET device shown in FIG. 2B. In this drawing, a trench isolation region 55 separates the pFET from the nFET. In this drawing, reference numeral 57 denotes the source/drain diffusion regions.

The following example is provided to illustrate an nFET that can be formed utilizing the processing steps described above.

EXAMPLE

In the sole example of the present application, an nFET comprising $Si/SiO_2/HfO_2/Ti/TiN/PolySi$ was prepared utilizing the basic processing steps described in the detailed description portion of the present invention. In this example, the deposition of the TiN capping layer was clustered to the deposition of the Ti (low workfunction elemental metal). Two gate stacks that were representative of the present invention were prepared; one including 10 Å Ti and 150 Å TiN, and the other including 20 Å Ti and 150 Å TiN. For comparison, an nMOS including TiN and an nMOS comprising polySi and SiON were also prepared.

Table 1 illustrates the effectiveness of the inventive nMOS structure after self-aligned MOSFET fabrication. The threshold voltage, Vt, the shift from mid-gap (towards nFET) and the inversion thickness, Tinv, are shown. The Vt and Tinv were measured using conventional techniques well known in the art. For example, the Vt was determined by calculating the current using the 300 nA Width/Length criteria for nFETs in a typical Drain current-Gate Voltage (Id-Vg) sweep and then using this current to calculate the gate voltage from the Id-Vg sweep which is defined as the Vt or threshold voltage of the device, and the Tinv was determined by calculating the Inversion capacitance using the well known Split C-V method and then using the well known relationship between capacitance and thickness to get the inversion thickness of the device.

TABLE 1

| Gate Stack nMOS | Vt | Shift from Mid-gap | Tinv |
| --- | --- | --- | --- |
| TiN (Prior art) | 0.47 | 110 mV | 15.5 Å |
| 10 Å Ti and 150 Å TiN (Inventive) | 0.42 | 160 mV | 14.3 Å |
| 20 Å Ti and 150 Å TiN | 0.29 | 290 mV | 12.5 Å |
| PolySi/SiON (Prior Art) | 0.03 | 550 mV | 31 Å |

Figure 4:
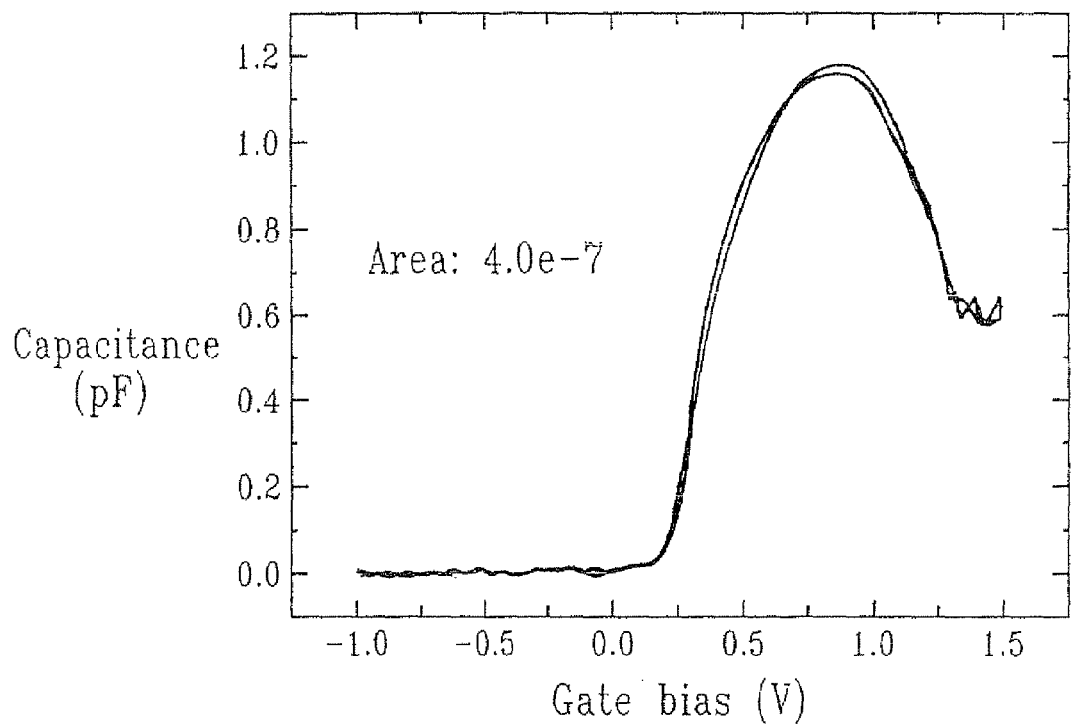
FIG. 4 is a capacitance (pico Farads, pF) vs. gate bias (volts, V) for an aggressively scaled and low threshold voltage device obtained by increasing the thickness of the low workfunction metal. In particular, the device includes a gate stack comprising $SiO_2/HfO_2/20$ Å Ti/150 Å TiN/polysilicon; capacitance maximum $C_{max}$=1.16 pF; inversion thickness $T_{inv}$=12 Å; and threshold voltage Vt=0.29 V.

In addition to the above, the data in Table 1 illustrates the ability to scale the interface and tune the Vt of the device by changing the thickness of the low workfunction metal. Reference is also made to FIG. 4 which illustrates that by increasing the thickness of the low workfunction layer, one can scavenge the interfacial oxide, i.e., $SiO_2$, layer underneath the $HfO_2$ and thereby provide extremely aggressive scaling. The increasing amounts of Ti also make the Vt more nFET approaching the bulk like workfunction of Ti.

This data clearly shows that by increasing the thickness of the low workfunction metal (in this case Ti), we can shift the Vt of the device to within 200-250 mV of the ideal nFET band-edge Vt (typical of n+Poly/SiON gate stacks. In addition, we can scale the inversion thickness and thereby improve the performance of the CMOS device While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What we claim is:

1. A semiconductor structure comprising:
    a semiconductor substrate;
    at least one nMOS device located on one region of said semiconductor substrate, the at least one nMOS device including a first gate stack comprising a first interfacial layer on the semiconductor substrate, a first dielectric layer having a thickness of less than 5 nm on the interfacial layer, a low workfunction elemental metal having a workfunction of less than 4.2 eV and a thickness of less than 3 nm on the first dielectric layer, and a first metallic capping layer on the low work function elemental metal; and
    at least one pMOS device located on another region of said semiconductor substrate, the at least one pMOS device including a second gate stack comprising at least a high workfunction elemental metal having a workfunction of greater than 4.9 eV and a second metallic capping layer, wherein a surface oxide layer is present between the high work function element metal and the second metallic capping layer of the at least one pMOS, said surface oxide layer is not present between the low work function element metal and the first metallic capping layer of the at least one nMOS device.

2. The semiconductor structure of claim 1 wherein said at least one pMOS device further includes a second interfacial layer on the semiconductor substrate, and a second dielectric layer on the second interfacial layer.

3. The semiconductor structure of claim 2 wherein said at least one of the first interfacial layer and the second interfacial layer comprises $SiO_2$ and at least one of the first dielectric layer and the second dielectric layer comprises $HfO_2$.

4. The semiconductor structure of claim 2 wherein the first dielectric layer of said at least one nMOS device is composed of a different material than the second dielectric layer of said at least one pMOS device.

5. The semiconductor structure of claim 4 wherein at least one of the first dielectric layer and the second dielectric layer is $SiO_2$, nitrided $SiO_2$, $Si_3N_4$, SiON, a high k insulator having a dielectric constant of greater than about 4.0 or multilayers thereof.

6. The semiconductor structure of claim 4 wherein at least one of the first dielectric layer and the second dielectric layer is a high k gate dielectric selected from the group consisting of $HfO_2$, $ZrO_2$, $Al_2O_3$, $TiO_2$, $La_2O_3$, $SrTiO_3$, $LaAlO_3$, $CeO_2$, $Y_2O_3$ and mixtures thereof.

7. The semiconductor structure of claim 2 further comprising a metallic stabilization layer between at least one of said first gate dielectric layer and said low workfunction elemental metal, and said second gate dielectric layer and said high work function elemental metal.

8. The semiconductor structure of claim 7 wherein said metallic stabilization layer has a thickness of less than 30 Å and is selected from the group consisting of TiN, TaSiN, TaSi, TaN and HfSi.

9. The semiconductor structure of claim 1 wherein said semiconductor substrate comprises Si, Ge, SiGe, SiC, SiGeC, Ge, GaAs, GaN, InAs, InP, organic semiconductors, Si/SiGe, a silicon-on-insulator (SOI), a SiGe-on-insulator (SGOI) or a germanium-on-insulator (GOI).

10. The semiconductor structure of claim 1 wherein said low workfunction elemental metal comprises a metal from Group IIIB, IVB or VB of the Periodic Table of Elements.

11. The semiconductor structure of claim 10 wherein said low workfunction elemental metal comprises Ti, La, Y, Hf, Ta, Nb, Zr or V.

12. The semiconductor structure of claim 11 wherein said low workfunction elemental metal is Ti.

13. The semiconductor structure of claim 1 wherein said high workfunction elemental metal is a metal from Group VIB, VIIB or VIII of the Periodic Table of Elements.

14. The semiconductor structure of claim 13 wherein said high workfunction elemental metal comprises Re, Ru, W, Ni or Ir.

15. The semiconductor structure of claim 1 wherein said first and second metallic capping layers comprise a metal nitride or a metal silicide wherein said metal is from IVB or VB of the Periodic Table of Elements.

16. The semiconductor structure of claim 15 wherein said first and second metallic capping layers each comprise TiN, TaSiN, TiAlN or TiAlN.

17. The semiconductor structure of claim 1 wherein said at least one nMOS and said at least one pMOS devices each include source/drain diffusion regions located in said semiconductor substrate.

18. The semiconductor structure of claim 1 further comprising an isolation region separating said at least one nMOS device from said at least one pMOS device.

* * * * *